United States Patent
van den Heuvel et al.

(10) Patent No.: US 10,236,894 B2
(45) Date of Patent: Mar. 19, 2019

(54) DIGITAL PHASE LOCKED LOOP AND METHOD FOR OPERATING THE SAME

(71) Applicant: Stichting IMEC Nederland, Eindhoven (NL)

(72) Inventors: Johan van den Heuvel, Geldrop (NL); Yao-Hong Liu, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/688,513

(22) Filed: Aug. 28, 2017

(65) Prior Publication Data

US 2018/0062660 A1 Mar. 1, 2018

(30) Foreign Application Priority Data

Aug. 30, 2016 (EP) ..................... 16186301

(51) Int. Cl.
*H03L 7/087* (2006.01)
*G04F 10/00* (2006.01)
(Continued)

(52) U.S. Cl.
CPC ............ *H03L 7/087* (2013.01); *G04F 10/005* (2013.01); *H03L 7/085* (2013.01); *H03L 7/091* (2013.01);
(Continued)

(58) Field of Classification Search
CPC ......... H03L 7/087; H03L 7/091; H03L 7/093; H03L 7/085; H03L 7/08; H03L 5/00; H03L 7/02; H03L 7/23
(Continued)

(56) References Cited

U.S. PATENT DOCUMENTS

| 8,207,770 B1 | 6/2012 | Ravi et al. |
| 8,508,266 B2 * | 8/2013 | Frantzeskakis ........... H03L 7/08 327/147 |

(Continued)

FOREIGN PATENT DOCUMENTS

EP 3 035 535 A1 6/2016

OTHER PUBLICATIONS

Chillara, Vamshi Krishna et al., "An 860 µW 2.1-to-2.7GHz All-Digital PLL-Based Frequency Modulator with a DTC-Assisted Snapshot TDC for WPAN (Bluetooth Smart and ZigBee) Applications", ISSCC 2014 / Session 9 / Low-Power Wireless / 9.8, 2014 IEEE International Solid-State Circuits Conference, Feb. 11, 2014, 3 pages.

(Continued)

*Primary Examiner* — John W Poos
(74) *Attorney, Agent, or Firm* — McDonnell Boehnen Hulbert & Berghoff LLP

(57) ABSTRACT

The present disclosure relates to a Digital Phase Locked Loop (DPLL) for phase locking an output signal to a reference clock signal. The DPLL comprises a phase detector for detecting a phase error of a feedback signal with respect to the reference clock signal. The DPLL comprises a digitally controlled oscillator for generating the output signal based at least on a frequency control word and at least one control signal representative of the phase error. The phase detector comprises an integer circuit for generating a first control signal representative of an integer phase error. The phase detector comprises a fractional circuit comprising a Time-to-Digital Converter (TDC) for processing the feedback signal and a delayed reference clock signal. The fractional circuit is provided for generating from the TDC output a second control signal representative of a fractional (Continued)

phase error. The DPLL comprises an unwrapping unit for unwrapping the TDC output.

17 Claims, 12 Drawing Sheets

(51) Int. Cl.
    *H03L 7/085* (2006.01)
    *H03L 7/091* (2006.01)
    *H03L 7/197* (2006.01)

(52) U.S. Cl.
    CPC ........ *H03L 7/1976* (2013.01); *H03L 2207/50* (2013.01)

(58) Field of Classification Search
    USPC ........................................ 327/156, 157, 158
    See application file for complete search history.

(56) References Cited

U.S. PATENT DOCUMENTS

| | | |
|---|---|---|
| 2009/0141845 A1 | 6/2009 | Ballantyne et al. |
| 2010/0134165 A1 | 6/2010 | Oh et al. |
| 2013/0113528 A1 | 5/2013 | Frantzeskakis et al. |
| 2013/0328604 A1* | 12/2013 | Matsuda ................ H03L 7/107 327/159 |

OTHER PUBLICATIONS

Zhuang, Jingcheng et al., "A Low-Power All-Digital PLL Architecture Based on Phase Prediction", 2012 19th IEEE International Conference on Electronics, Circuits and Systems (ICECS), Dec. 2012, pp. 797-800.

Wu, Ying et al., "A Digital PLL With a Multi-Delay Coarse-Fine TDC", 29th Norchip Conference, 2011, 4 pages.

Hsu, Chun-Ming et al., "A Low-Noise Wide-BW 3.6-GHz Digital ΔΣ Fractional-N Frequency Synthesizer With a Nose-Shaping Time-to-Digital Converter and Quantization Noise Cancellation", IEEE Journal of Solid-State Circuits, vol. 43, No. 12, Dec. 2008, pp. 2776-2786.

Gaur, Vikas et al., "Behavioral Modeling and VHDL Simulation of an All-Digital Phase Locked Loop", IJSRD-International Journal for Scientific Research & Development, vol. 2, No. 3, 2014, pp. 100-103.

Tasca, Davide et al., "A 2.9-4.0-GHz Fractional-N Digital PLL With Bang-Bang Phase Detector and 560-fsrms Integrated Jitter at 4.5-nW Power", IEEE Journal of Solid-State Circuits, vol. 46, No. 12, Dec. 2011, pp. 2745-2758.

Tasca, Davide et al., "A 2.9-to-4.0GHz Fractional-N Digital PLL With Bang-Bang Phase Detector and 560fsrms Integrated Jitter at 4.5mW Power", ISSCC 2011 / Session 5 / PLLs / 5.1, 2011 IEEE International Solid-State Circuits Conference, Feb. 21, 2011, pp. 88-90.

\* cited by examiner

FIG. 1

DIGITAL PHASE LOCKED LOOP AND METHOD FOR OPERATING THE SAME

CROSS-REFERENCE TO RELATED APPLICATION

The present application is a non-provisional patent application claiming priority to European Patent Application No. 16186301.4 filed Aug. 30, 2016, the contents of which are hereby incorporated by reference.

TECHNICAL FIELD

The present disclosure relates to a Digital Phase Locked Loop (DPLL) with an improved tracking of a phase lock of an output signal to a reference clock signal and with a reduced power consumption. The present disclosure also relates to a method for operating the DPLL.

BACKGROUND

In a low power All Digital Phase Locked Loop (ADPLL) such as described, for example, in Chillara et al., "An 860 µW 2.1-to-2.7 GHz All-Digital PLL-Based Frequency Modulator with a DTC-Assisted Snapshot TDC for WPAN (Bluetooth Smart and ZigBee) Applications," IEEE INTI SOLID-STATE CIRCUITS CONFERENCE (ISSCC) (2014), the clock edges of a digitally controlled oscillator (DCO) are retimed via a Digital-to-Time Converter (DTC) such that a power-hungry Time-to-Digital Converter (TDC) can be reduced in size. During initial locking, an asynchronous counter is used as a phase incrementor to calibrate the DCO. The counter is a power-hungry block that is switched off as soon as possible. For final phase locking, the tracking bank is used, and the counter is switched off. This set-up has, however, the disadvantage that the ADPLL can be easily pulled to a false locking state by a frequency disturbance when the counter is switched off, such that the counter needs to be switched back on, thereby increasing energy consumption of the ADPLL. In this false locking state, the TDC output is continuously switching between maximum and minimum output values, creating a stable point at an undesired frequency.

SUMMARY OF THE DISCLOSURE

Embodiments of the present disclosure may provide a Digital Phase Locked Loop that allows for an improved tracking of a phase lock of an output signal to a reference clock signal.

The present disclosure may provide, according to a first aspect, a Digital Phase Locked Loop (DPLL) for phase locking an output signal to a reference clock signal. The DPLL may comprise a phase detector, such as a sub-sampling phase detector, configured for detecting a phase error of a feedback signal with respect to the reference clock signal. The feedback signal is the output signal of the DPLL fed back to the input of the phase detector. The DPLL may further comprise a digitally controlled oscillator (DCO) configured for generating the output signal based at least on a frequency control word and at least one control signal representative of the phase error detected by the phase detector. The phase detector may comprise an integer circuit configured for generating a first control signal representative of an integer phase error. The phase detector may comprise a fractional circuit comprising a Time-to-Digital Converter (TDC), such as a snapshot TDC, configured for processing the feedback signal and a delayed reference clock signal. The fractional circuit is configured for generating from the TDC output a second control signal representative of a fractional phase error. The DPLL may further comprise an unwrapping unit configured for unwrapping the TDC output.

The limited bandwidth of the DPLL, which may be required to optimize for noise and spectral purity in the phase-locked state, may cause wrapping of the TDC output in response to frequency disturbances, which may result in the false locking states. Here, the use of the unwrapping unit for unwrapping the TDC output in the digital domain may allow for increasing the capture or lock-in range of the DPLL without having to increase the loop bandwidth of the DPLL, which would result in a noise increase and reduced spectral purity of the output signal.

The unwrapping may also allow for enabling relocking much faster, e.g., returning back to the previous frequency output when confronted with a frequency disturbance. The reason the locking may be slower without the unwrapping is because the DPLL detects a very small offset in the average TDC output, and it can only control the DCO on that average. The DPLL can only control on the average due to the limited loop bandwidth of the DPLL. When unwrapping the TDC output, however, the average offset controlling the DCO becomes bigger at every wrap-around. This means the average increases rapidly over time, allowing the DPLL to relock much faster.

In an embodiment of the DPLL, according to the present disclosure, the DPLL may comprise a processing unit configured for activating the integer circuit to obtain initial phase locking. The processing unit may be configured for deactivating the integer circuit when initial phase locking is obtained.

Deactivating the power-hungry integer circuit after obtaining initial phase locking while further tracking phase/frequency changes by means of the fractional circuit may allow for reduced power consumption of the DPLL. This processing unit provided for activating/deactivating the integer circuit may be the same processing unit as the processing unit providing the functionality of the unwrapping unit, but may also be a separate processing unit.

The initial phase lock is a phase lock that is obtained with both the integer circuit and the fractional circuit active, after which the power-hungry integer circuit is deactivated, such that the fractional circuit, which may consume less power, performs the further phase tracking.

In an embodiment of the DPLL, according to the present disclosure, the unwrapping unit may be configured for unwrapping the TDC output by shifting the TDC output by a predetermined unwrap value in a direction opposite of the change in the TDC output when the absolute change in the TDC output is larger than a predetermined limit value. The DPLL may, for example, be provided as such by adding double the maximum TDC output code to the TDC output in case of a negative change in the TDC output with an absolute value larger than the maximum TDC output code, and by subtracting double the minimum TDC output code from the TDC output in case of a positive change in the TDC output larger than the minimum TDC output code.

The shifting of the TDC output with the predetermined unwrap value when the change between subsequent TDC output codes is too large, e.g., larger than the predetermined limit value, may allow for unwrapping of the TDC output without further complicating the design of the DPLL.

In an embodiment of the DPLL, according to the present disclosure, the unwrapping unit may comprise a differentiator configured for differentiating subsequent TDC output codes. The unwrapping unit may comprise a re-wrap unit configured for re-wrapping the differentiated TDC output codes by: (a) adding the unwrap value to the differentiated TDC output code in case of a negative differentiated TDC output code having an absolute value larger than the limit value, and/or (b) subtracting the unwrap value from the differentiated TDC output code in case of a positive differentiated TDC output code having an absolute value larger than the limit value. The unwrapping unit may comprise an integrator configured for integrating the re-wrapped differentiated TDC output codes to obtain the unwrapped TDC output codes.

In an embodiment of the DPLL, according to the present disclosure, the differentiator may be further configured for leaking a predetermined amount of the TDC output codes to the differentiated TDC output codes.

Leaking the predetermined amount of the TDC output codes to the differentiated TDC output codes, e.g., the differentiator being a slightly leaky differentiator, may enable the removal of any leftover DC components of the TDC code.

In an embodiment of the DPLL, according to the present disclosure, the DPLL may comprise at least one calibration loop, for example, for calibrating DPLL parameters. The unwrapping unit may be configured for disabling each calibration loop when the unwrapped TDC output is outside a predetermined range. The unwrapping unit may be configured for re-enabling each calibration loop, such as after a predetermined period, when the unwrapped TDC output is inside the predetermined range again.

Since the calibration loops may be designed to operate under the assumption that the DPLL is in a phase-locked state, the calibration loop may be disabled in the presence of frequency disturbances, which may be tracked by using the unwrapped TDC output. This may allow the DPLL to re-obtain phase locking without being interfered with by the calibration loops.

Re-enabling the calibration loops after a predetermined period when the unwrapped TDC output is inside the predetermined range again may give the DPLL a sufficient amount of time to achieve a stable phase lock without being interfered with by the calibration loops. This may also improve the operation of the calibration loops when they are re-enabled or reactivated.

In a second aspect of the present disclosure, which may be wholly or partially combined with the first aspect of the present disclosure, the TDC has an increased out-of-range gain. The TDC may, for example, be configured with the increased out-of-range gain by multiplying the minimum TDC output code and the maximum TDC output code with a predetermined gain factor. The TDC may, for example, be configured with the increased out-of-range gain by increasing the output code for the maximum TDC output value by a predetermined increase value, and/or by decreasing the output code for the minimum TDC output value by a predetermined decrease value.

Instead of unwrapping the TDC output, increasing the out-of-range gain of TDC in the digital domain is another way of increasing the capture or lock-in range of the DPLL without having to increase the loop bandwidth of the PLL which would result in a noise increase and reduced spectral purity of the output signal.

The out-of-range gain of the TDC may be increased by means of a processing unit processing the TDC output codes. This processing unit may be the same processing unit as the processing unit providing the functionality of activating/deactivating the integer circuit and/or the processing unit providing the functionality of the unwrapping unit, but may also be a separate processing unit.

The combination of the first aspect of the present disclosure, e.g., the unwrapping of the TDC output, and the second aspect of the present disclosure may allow both aspects to reinforce one another. Hence, the combination may provide a greater increase in the capture or lock-in range of the DPLL than that which may be achieved from the increase in capture or lock-in range for each aspect individually.

Furthermore, the present disclosure provide, according to a first aspect, a method for operating a Digital Phase Locked Loop (DPLL) for phase locking an output signal to a reference clock signal. The method may comprise a step a) of supplying the reference clock signal to a first input of a phase detector of the DPLL. The method may further comprise a step b) of supplying the output signal as a feedback signal to a second input of the phase detector. The method may further comprise a step c) of generating, using an integer circuit of the phase detector, a first control signal representative of an integer phase error of the feedback signal with respect to the reference clock signal. The method may further comprise a step d) of processing, using a Time-to-Digital Converter (TDC) of a fractional circuit of the phase detector, the feedback signal and a delayed reference clock signal, and generating from the TDC output a second control signal representative of a fractional phase error of the feedback signal with respect to the reference clock signal. The method may further comprise a step e) of regenerating the output signal using a digitally controlled oscillator (DCO) of the DPLL based at least on a frequency control word and at least one of the first control signal and the second control signal. The method may further comprise a step f) of repeating steps b) to e) to obtain initial phase locking of the output signal to the reference clock signal. The method may further comprise a step g) of deactivating the integer circuit of the phase detector after obtaining the initial phase locking. The method may further comprise a step h) of repeating steps b), d) and e) for tracking the phase lock of the output signal to the reference clock signal. Step d) may further comprise unwrapping the TDC output using an unwrapping unit of the DPLL.

The effects of performing such a method, according to the present disclosure, and its example embodiments may be similar to those discussed with respect to the DPLL, according to the present disclosure, and its example embodiments.

In an embodiment of the method, according to the present disclosure, the unwrapping of the TDC output using the unwrapping unit may comprise shifting the TDC output by a predetermined unwrap value in a direction opposite of the change in the TDC output when the absolute change in the TDC output is larger than a predetermined limit value.

In an embodiment of the method, according to the present disclosure, the unwrapping of the TDC output using the unwrapping unit may comprise differentiating subsequent TDC output codes. The unwrapping of the TDC output using the unwrapping unit may further comprise re-wrapping the differentiated TDC output codes by: (a) adding the unwrap value to the differentiated TDC output code in case of a negative differentiated TDC output code having an absolute value larger than the limit value, and/or (b) subtracting the unwrap value from the differentiated TDC output code in case of a positive differentiated TDC output code having an absolute value larger than the limit value. The unwrapping of the TDC output using the unwrapping unit may further comprise integrating the re-wrapped differentiated TDC output codes to obtain the unwrapped TDC output codes.

In an embodiment of the method, according to the present disclosure, the differentiating of subsequent TDC output codes may comprise adding a predetermined amount of the TDC output codes to the differentiated TDC output codes.

In an embodiment of the method, according to the present disclosure, the DPLL may comprise at least one calibration loop, for example, for calibrating DPLL parameters. The method may further comprise a step, performed by the unwrapping unit, of disabling each calibration loop when the unwrapped TDC output is outside a predetermined range. The method may further comprise a step, performed by the unwrapping unit, of re-enabling each calibration loop, such as after a predetermined period, when the unwrapped TDC output is inside the predetermined range again.

In a second aspect of the present disclosure, which may be combined with the first aspect of the present disclosure, the method may further comprise a step, performed by a processing unit of the DPLL, of increasing the out-of-range gain of the TDC.

BRIEF DESCRIPTION OF THE DRAWINGS

FIG. 1 shows a schematic representation of a DPLL, according to an example embodiment.

DETAILED DESCRIPTION

Figure 2:
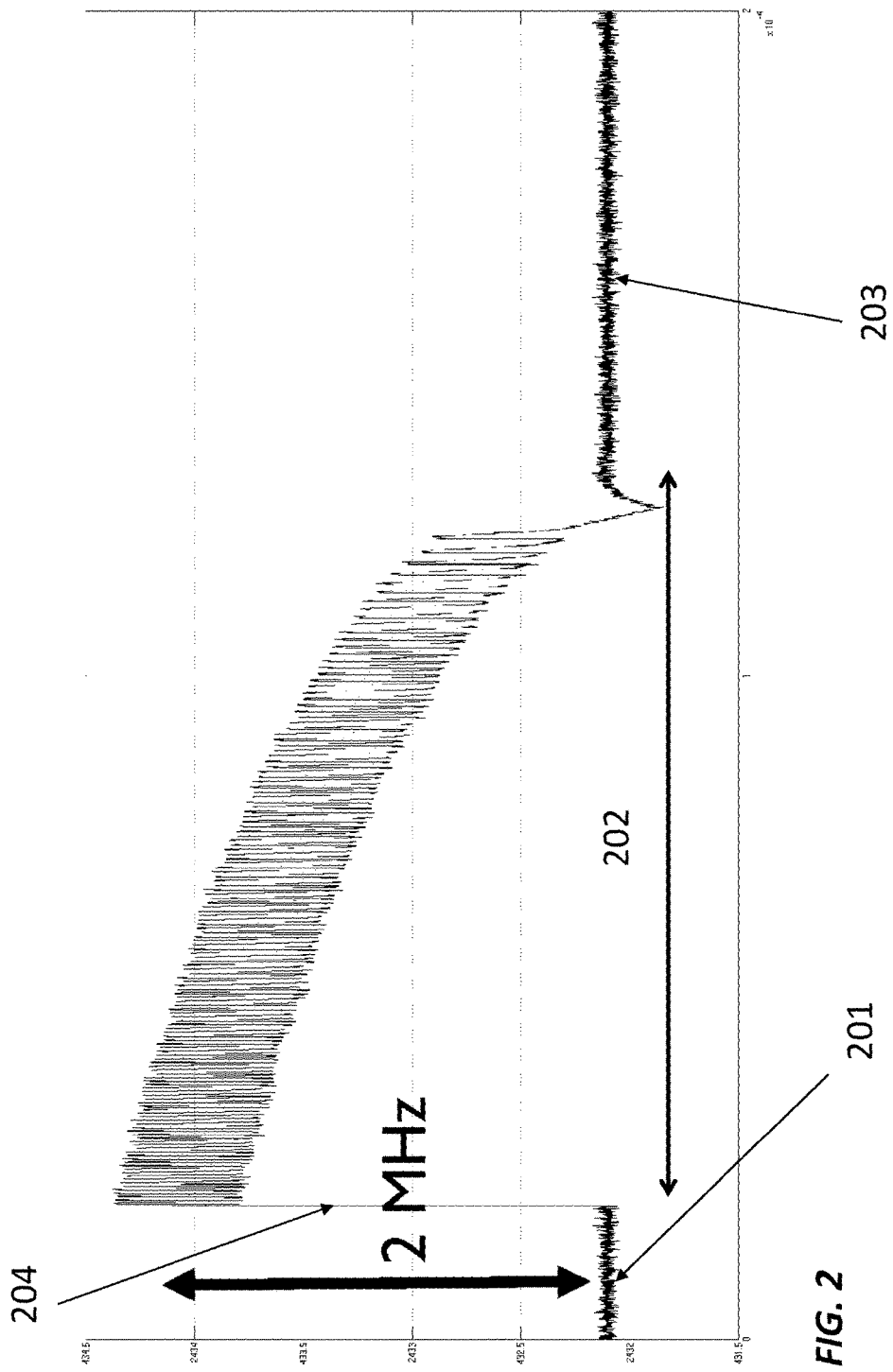
FIG. 2 shows a frequency output of the DPLL of FIG. 1, in response to a frequency disturbance of 2 MHz, resulting in a phase-locked state, according to an example embodiment.

The present disclosure will be described with respect to particular embodiments and with reference to certain drawings, but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not necessarily correspond to actual reductions to practice of the disclosure.

Furthermore, the terms first, second, third, and the like in the description and in the claims are used for distinguishing between similar elements and not necessarily for describing a sequential or chronological order. The terms are interchangeable under appropriate circumstances, and the embodiments of the disclosure can operate in other sequences than described or illustrated herein.

Moreover, the terms top, bottom, over, under, and the like in the description and the claims are used for descriptive purposes and not necessarily for describing relative positions. The terms so used are interchangeable under appropriate circumstances, and the embodiments of the disclosure described herein can operate in other orientations than described or illustrated herein.

Furthermore, the various embodiments are to be construed as example manners in which the disclosure may be implemented rather than as limiting the scope of the disclosure.

The term "comprising," used in the claims, should not be interpreted as being restricted to the elements or steps listed thereafter; it does not exclude other elements or steps. It should be interpreted as specifying the presence of the stated features, integers, steps, or components as referred to, but does not preclude the presence or addition of one or more other features, integers, steps, components, or groups thereof. Thus, the scope of the expression "a device comprising A and B" should not be limited to devices consisting only of components A and B, but rather, with respect to the present disclosure, the only enumerated components of the device are A and B. Further, the claim should be interpreted as including equivalents of those components.

Within the context of the present disclosure, the term "Digitally Controlled Oscillator" or "DCO" is meant as a controlled oscillator that is either directly or indirectly controlled or operated by using one or more digital control words. The DCO may, for example, be a generally known DCO that is directly controlled by means of one or more digital control words. The DCO may, however, also be a combination of a Digital-to-Analog Converter (DAC) followed by a Voltage Controlled Oscillator (VCO). With this combination, a digital control word presented to the DCO can be converted to an analog signal by the DAC, and the analog signal can then control the VCO.

Figure 1:
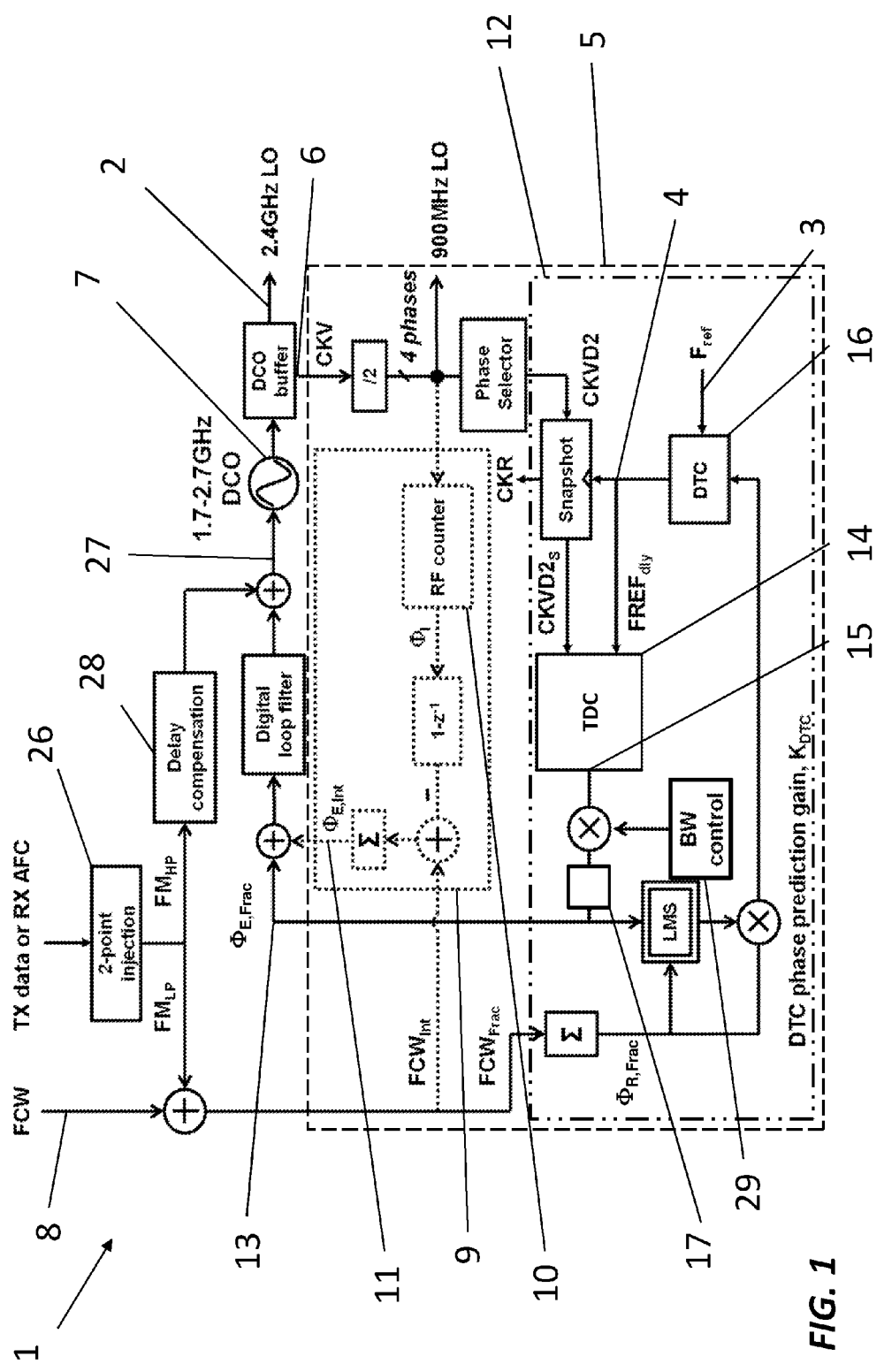

FIG. 1 shows a sub-sampling DPLL 1, according to an example embodiment of the present disclosure. A two-point injection 26 may be used for wide-band frequency modulation. The low frequency modulation data FMLP may be added to the Frequency Control Word (FCW) 8. The high frequency modulation data $FM_{HP}$ may be added after delay compensation 28 to the control word 27 controlling the Digitally Controlled Oscillator (DCO) 7. The two-point injection 26 may allow the modulation bandwidth to exceed the bandwidth of the DPLL 1. A snapshot technique may be implemented in the Time-to-Digital Converter (TDC) 14 to reduce its operation speed. The TDC 14 may "sub-sample" the RF clock edges CKVD2 with a low-frequency reference clock signal 3, reducing the sampling rate from a GHz frequency to a reference frequency $F_{ref}$. A Digital-to-Time Converter (DTC) 16 may be included to perform phase prediction in fractional-N operation, and it may also reduce the detection range of the TDC 14 by more than 70%. The combination of the DTC 16 and the snapshot technique may achieve ~200× power reduction compared to conventional TDCs. Furthermore, in comparison to the single-bit TDC implementation in bang-bang PLLs, such as described, for example, in Tasca et al., "A 2.9-to-4.0 G Hz fractional-N digital PLL with bang-bang phase detector and 560 fs rms integrated jitter at 4.5 mW power," ISSCC DIG. TECH PAPERS, pp. 88-90, (February 2011), the multi-bit TDC 14 can provide soft phase error information and may allow for more sophisticated calibration or enhancement algorithms to be deployed, while avoiding the issues of highly noise-dependent loop dynamics and slow frequency settling.

The integer phase error (for frequency acquisition) and fractional phase error (for phase acquisition) may be separately processed, respectively in an integer circuit 9 and a fractional circuit 12. The integer circuit 9 may comprise an RF counter 10 for the integer phase detection, which may be power-hungry because it is continuously triggered by the RF clock (CKVD2). In addition, the integer and fractional phase errors may be combined in the digital domain, so potential "periodic phase glitches" due to the timing misalignment between two independent phase error detections can lead to high fractional spurs. Therefore, the integer phase detection in the integer circuit 9, which functions as a Frequency Locked Loop (FLL), may be completely shut down and gated after the DPLL 1 acquires an initial phase lock. Hence, the DPLL 1 may only rely on the snapshot TDC 14 of the fractional circuit 12 to acquire and maintain the phase-locked state (e.g., tracking), which may save power consumption and may also avoid introducing periodic phase glitches. The deactivation of the integer circuit 9 may be controlled by a processing unit (not shown) of the DPLL 1.

Although the DPLL 1 may provide sufficient phase noise performance in the locked state, it may have a limited "lock-in range" or "capture range" without the assistance of the integer circuit 9. Here, the lock-in or capture range is the frequency range in which the DPLL 1, while in a phase-locked state and confronted with an abrupt change of frequency, is still able to acquire phase-lock without cycle slipping.

A response to a frequency disturbance within the lock-in range is shown in FIG. 2, which shows a plot of the frequency output of the DPLL 1 as a function of time in response to a frequency disturbance 204 of 2 MHz. The plot shows the stable frequency output of the DPLL 1 in a first section 201 where the DPLL 1 is in a phase-locked state. When confronted with the frequency disturbance 204 of 2 MHz, the frequency output changes upwards to a higher frequency. For this frequency disturbance 204 of 2 MHz, however, the DPLL 1 is able to re-acquire the phase lock after a limited time period 202, such that the frequency output pulls back to the initial stable frequency output in the final section 203.

Figure 3:
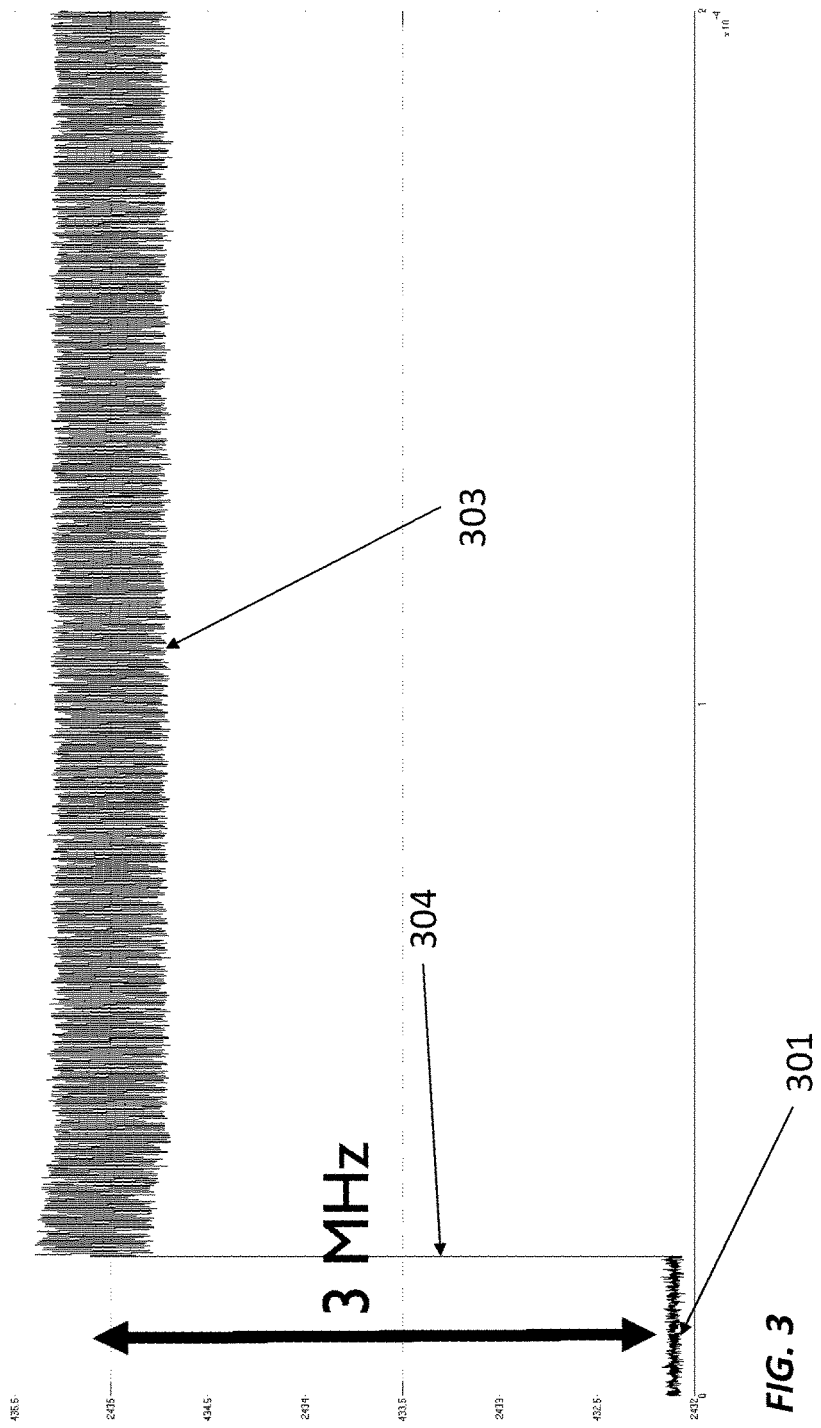
FIG. 3 shows a frequency output of the DPLL of FIG. 1 in response to a frequency disturbance of 3 MHz, resulting in a false locking state, according to an example embodiment.

A response to a frequency disturbance outside of the lock-in range is shown in FIG. 3, which shows a plot of the frequency output of the DPLL 1 as a function of time in response to a frequency disturbance 304 of 3 MHz. The plot shows the stable frequency output of the DPLL 1 in a first section 301 where the DPLL 1 is in a phase-locked state. When confronted with the frequency disturbance 304 of 3 MHz, the frequency output changes upwards to a higher frequency. For this frequency disturbance 304 of 3 MHz, however, the DPLL 1 is no longer able to recover to the phase-locked state, and the frequency output ends up in a false locking state in the final section 303.

Figure 4:
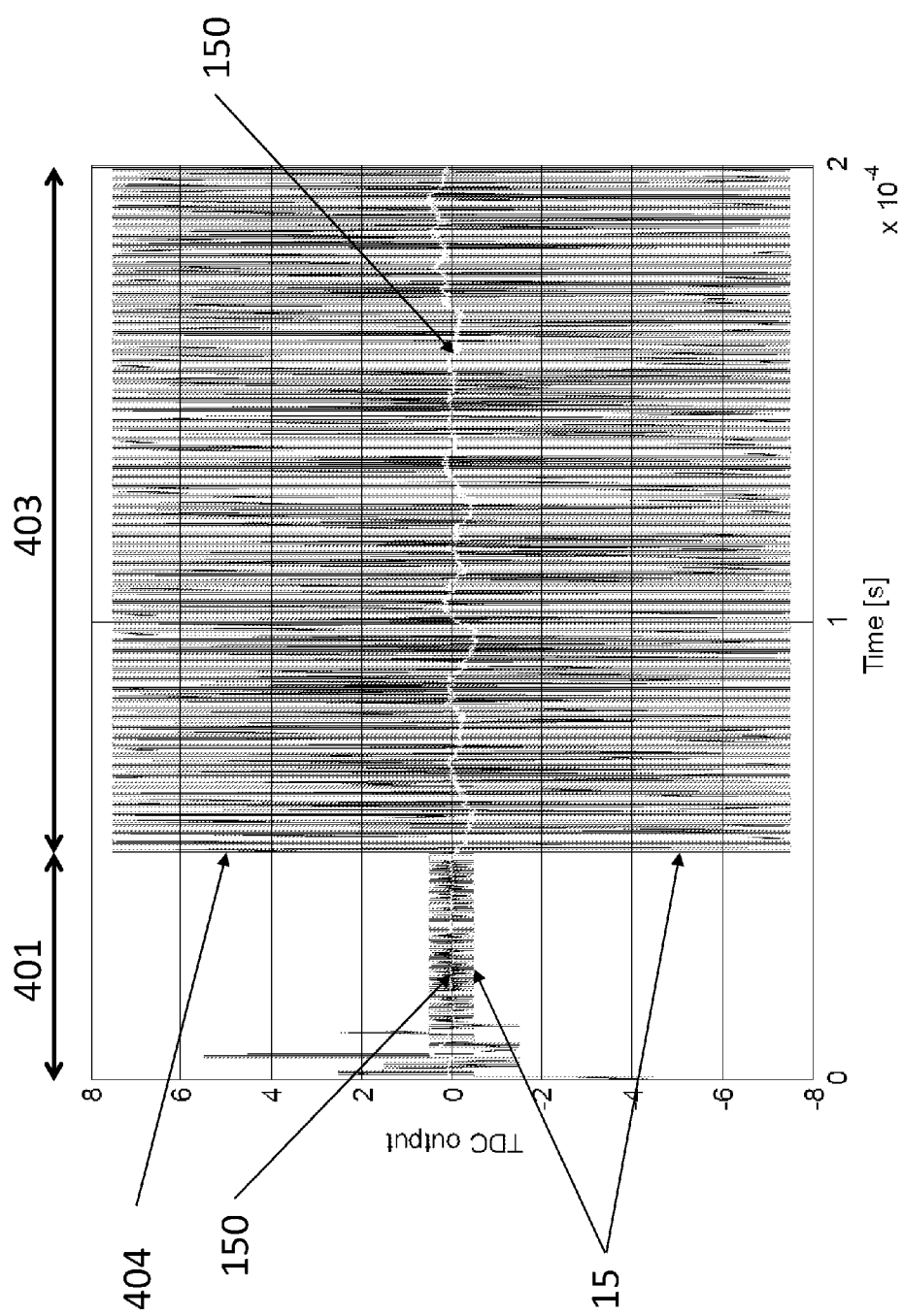
FIG. 4 shows a TDC output of the DPLL of FIG. 1, in response to a frequency disturbance resulting in a false locking state, according to an example embodiment.

In case of a frequency disturbance outside of the lock-in range, the DPLL 1 becomes unstable due to cycle slipping of the TDC output 15, which is shown in FIG. 4. FIG. 4 shows a plot of both the TDC output 15 and a moving average 150 (320 samples) of the TDC output 15 as a function of time in response to a frequency disturbance 404 outside of the lock-in range at 50 μs. The plot shows the stable TDC output 15 averaging around zero in a first section, where the DPLL 1 is in a phase-locked state. When confronted with the frequency disturbance 404 at 50 μs, the TDC output 15 becomes unstable and alternates between the minimum, the maximum, and some of the intermediate TDC output codes 15 in the final section 403. The average TDC output 150, however, remains close to zero, such that a second control signal 13 generated from the TDC output 15 also averages around zero, and such that the output signal 2 generated by the DCO 7 from the second control signal 13 does not change on average. Thus, resulting in the false locking state of the DPLL 1.

Assuming a damping factor $\zeta$ of the DPLL 1 is designed to be approximately 0.7 to provide an improved stability of the DPLL 1 and a settling behavior for a second-order system, the loop bandwidth $\omega_{Loop}$, natural frequency $\omega_n$, and the lock-in range $\omega_{LI}$ of the DPLL 1 can be approximated as:

$$\omega_{Loop} \approx \alpha \cdot f_{REF}$$

$$\omega_n \approx \sqrt{\rho} \cdot f_{REF}$$

$$\omega_{LI} \approx 1.8 \cdot \omega_n \cdot (\zeta+1) \approx 3 \cdot \sqrt{\rho} \cdot f_{REF} \approx 2 \cdot \alpha f_{REF} \approx 2 \omega_{Loop}$$

where $\alpha$ is the gain in the proportional path of the loop filter, i.e., the fractional circuit 12, and $\rho$ is the gain in the integer circuit 9. On the one hand, the DPLL 1 may have a rather narrow loop bandwidth $\omega_{Loop}$ (e.g., of the order of a few-hundred kHz) to suppress noise and spurs introduced in the reference path, e.g., reference clock signal 3, DTC 16, or TDC 14. On the other hand, a small loop bandwidth may make the DPLL 1 vulnerable to a frequency perturbation or disturbance, which may make it less reliable during normal operation.

Now, a second and a first performance enhancement technique according to the different aspects of the present disclosure are discussed.

A. Increasing the Out-of-Range Gain

Figure 5B:
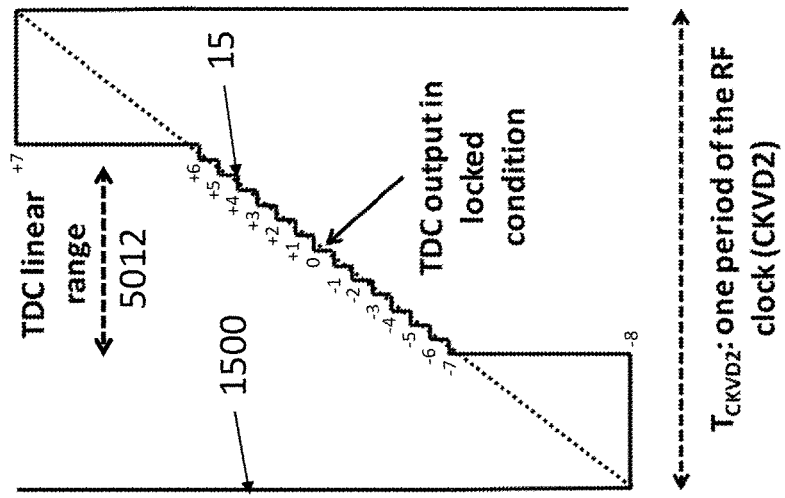
FIG. 5*b* shows a TDC output gain curve of a TDC with an increased out-of-range gain, according to an example embodiment.
Figure 5A:
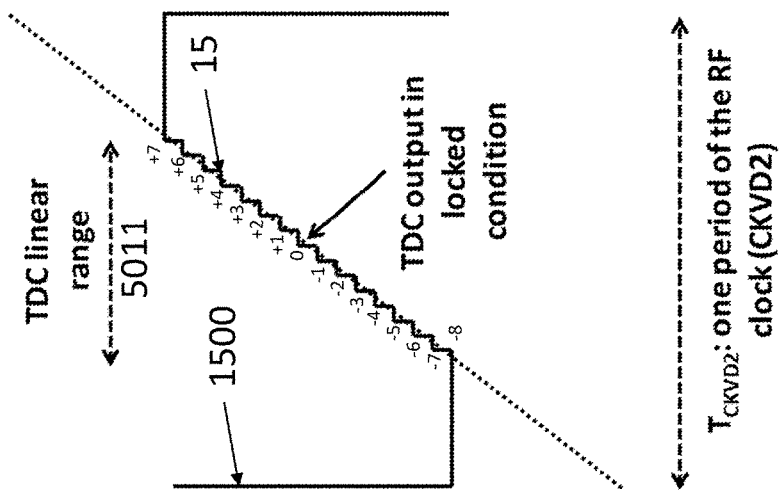
FIG. 5*a* shows a TDC output gain curve of a TDC with a normal out-of-range gain, according to an example embodiment.

According to a second enhancement technique (second aspect of the present disclosure), a 4-bit TDC 14 with an increased out-of-range gain is used, of which the TDC output gain curve 1500 is illustrated in FIG. 5b, instead of a 4-bit TDC 14 with a normal out-of-range gain, of which the TDC output gain curve 1500 is illustrated in FIG. 5a.

When the TDC output 15 of the TDC 14 with the normal out-of-range gain is within its linear range 5011, e.g., the full 4-bit linear range of the TDC output code 15 from −8 to +7, the phase error has a normal weighting, and the DPLL 1 has a normal loop bandwidth.

When the TDC output 15 of the TDC 14 with the increased out-of-range gain is within its linear range 5012, e.g., the TDC output code 15 is from −7 to +6, the phase error also has a normal weighting, and the DPLL 1 has a normal loop bandwidth. However, when the full-scale TDC outputs 15 are detected, e.g., the minimum TDC output code 15 of −8 and the maximum TDC output code 15 of +7, a processing unit 29 of the fractional circuit 12, such as, for example, shown in FIG. 1, provides a higher weighting, which equivalently increases the proportional gain a of the fractional circuit 12, and thus also the lock-in range.

Hence, the presented DPLL 1 using the second enhancement technique may have a normal loop bandwidth optimized for noise and spectral purity in the phase-locked state, and an extended lock-in range for a better tolerance to the frequency disturbance. Furthermore, the DPLL 1 with the increased TDC out-of-range gain may also have a faster settling speed, which may allow it to more quickly start-up or switch to another channel. This may reduce the average power consumption, for example, of a heavily duty-cycled radio system like Bluetooth® Low Energy (BLE). This lock-in range extension technique may be readily implemented in the DPLL 1.

Figure 6:
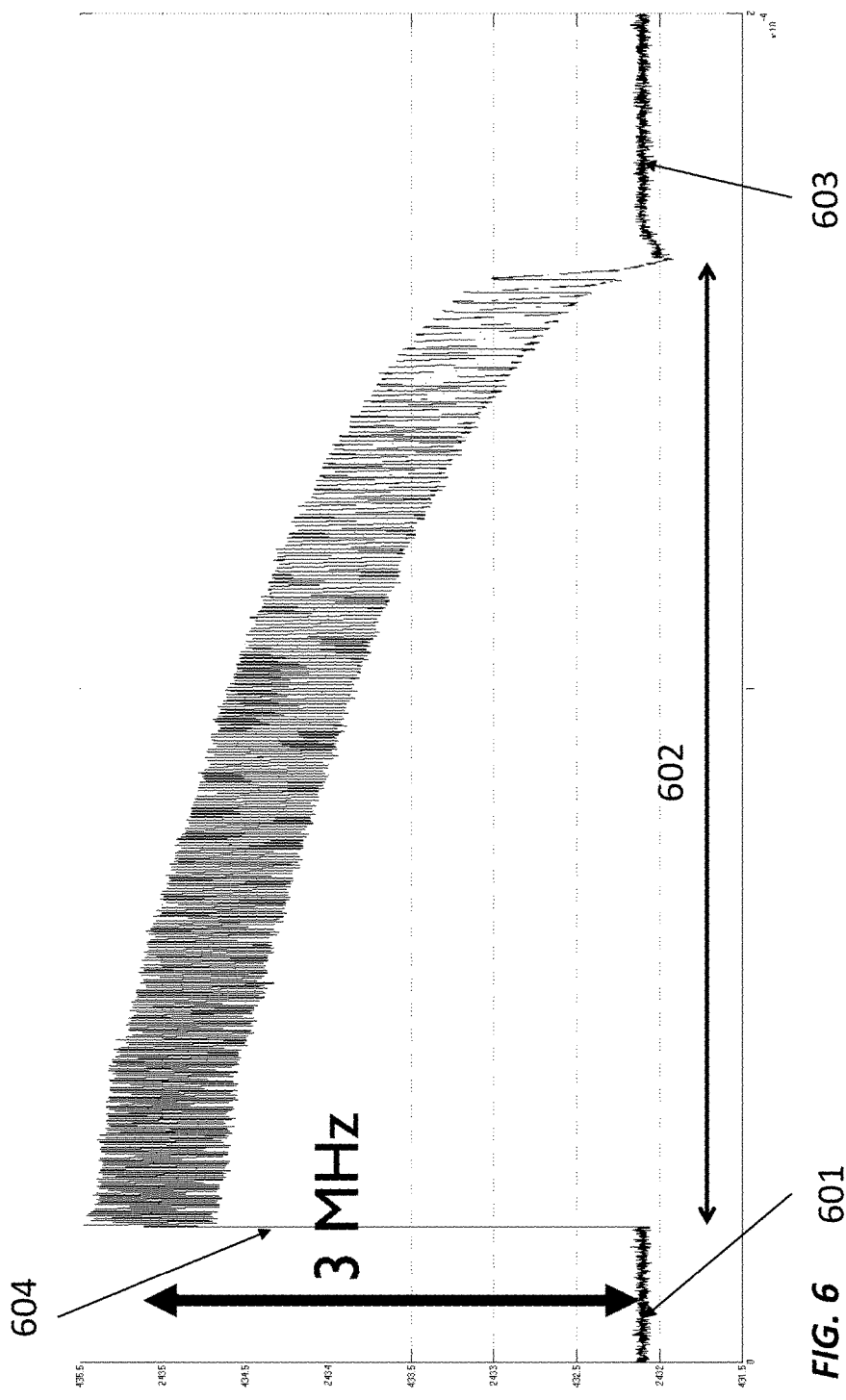
FIG. 6 shows a frequency output of the DPLL of FIG. 1, with the increased out-of-range gain of the TDC, in response to a frequency disturbance of 3 MHz, resulting in a phase-locked state, according to an example embodiment.

A response to a frequency disturbance 604 on the frequency output of the DPLL 1 is shown in FIG. 6. This figure shows a plot of the frequency output of the DPLL 1 as a function of time in response to a frequency disturbance 604 of 3 MHz, which is the same size as the frequency disturbance 304 in FIG. 3. The plot shows the stable frequency output of the DPLL 1 in a first section 601 where the DPLL 1 is in a phase-locked state. When confronted with the frequency disturbance 604 of 3 MHz, the frequency output changes upwards to a higher frequency. In comparison with the frequency disturbance 304 of 3 MHz in FIG. 3, however, the DPLL 1 is now able to re-acquire the phase lock after a limited time period 602, such that the frequency output pulls back to the initial stable frequency output in the final section 603. This is caused by the TDC 14 with the increased out-of-range gain, which provides a stronger feedback force to bring the DPLL 1 back to the phase-locked state.

Figure 7:
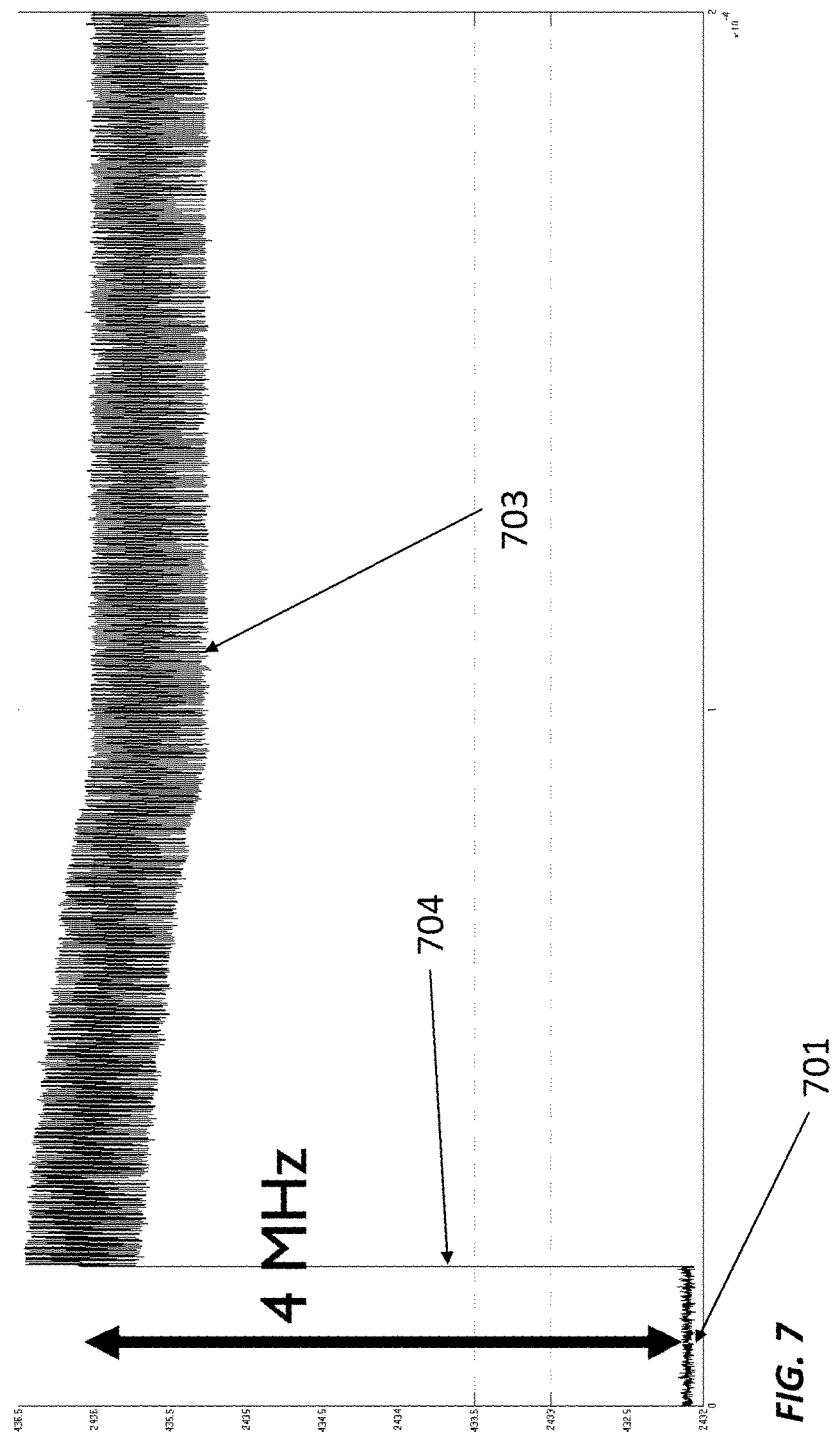
FIG. 7 shows a frequency output of the DPLL of FIG. 1, with the increased out-of-range gain of the TDC, in response to a frequency disturbance of 4 MHz, resulting in a false locking state, according to an example embodiment.

A response to a larger frequency disturbance is shown in FIG. 7, which shows a plot of the frequency output of the DPLL 1 as a function of time in response to a frequency disturbance 704 of 4 MHz. The plot shows the stable frequency output of the DPLL 1 in a first section 701 where the DPLL 1 is in a phase-locked state. When confronted with the frequency disturbance 704 of 4 MHz, the frequency output changes upwards to a higher frequency. For this frequency disturbance 704 of 4 MHz, however, the DPLL 1 is no longer able to recover to the phase-locked state, and the frequency output ends up again in a false locking state in the final section 703.

As shown, the use of the second enhancement technique alone may result in an increase of the lock-in or capture range. A further improvement, however, may be found in a first enhancement technique (first aspect of the present disclosure), which is discussed below in combination with the second enhancement technique, but may also be used independently of the second enhancement technique.

B. Unwrapping the TDC Output

By observing the output 15 of the TDC 14, the TDC output 15 can be seen as a small part of a phase trajectory. By properly unwrapping this phase trajectory in the digital domain by means of a processing unit 17 configured for this purpose, e.g., an unwrapping unit 17 (shown in FIG. 1), a better phase trajectory may be provided for the loop filter, and the observed false locking states can be omitted. As such, the unwrapping may extend the lock-in range or capture range.

In an embodiment according to the present disclosure, the unwrapping may be performed by looking at the difference between subsequent TDC output codes 15. If an increase in the TDC output 15 is larger than a predetermined limit value, then a predetermined unwrap value is subtracted from the TDC output 15, such that an upward change that is too large is corrected downwards. If a decrease in the TDC output 15 is larger than the predetermined limit value, then the predetermined unwrap value is added to the TDC output code 15, such that a downward change that is too large is corrected upwards. It should, however, be clear that other known methods may be used for reconstructing the phase trajectory.

Figure 8:
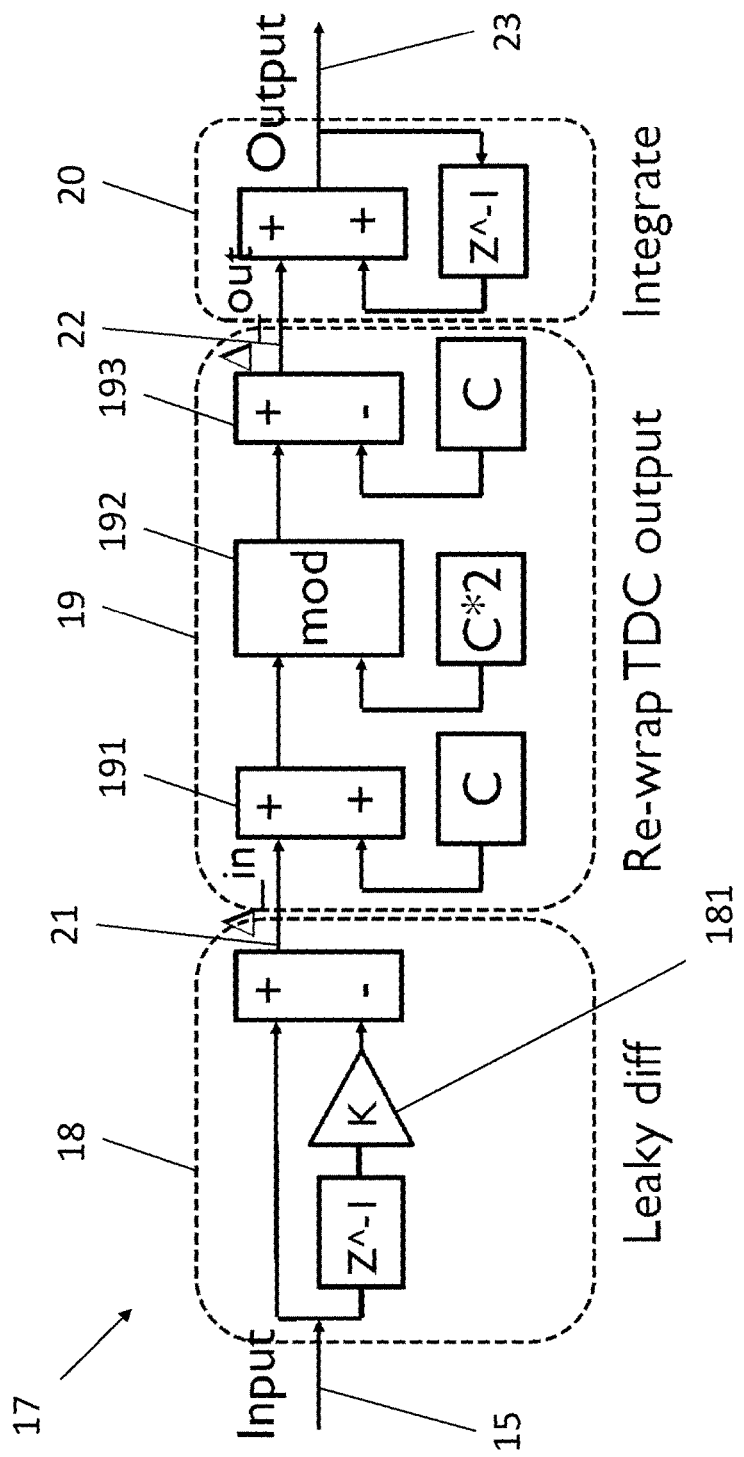
FIG. 8 shows a schematic representation of an unwrapping unit for the DPLL of FIG. 1, according to an example embodiment.

FIG. 8 shows a schematic overview of an unwrapping unit 17 according to an embodiment of the present disclosure. The unwrapping unit 17 may comprise three main components, including a differentiator 18 followed by a re-wrap unit 19 and an integrator 20.

The differentiator 18 may be configured for taking the difference between subsequent TDC output codes 15, and for forwarding the differentiated TDC output codes 21 (Δ in) to the re-wrap unit 19 of the unwrapping unit 17 for further processing. The differentiator 18, according to this embodiment, is depicted as a slightly leaky differentiator 18, which adds or "leaks" a predetermined amount of the TDC output codes 15 to the differentiated TDC output codes 21 (Δ_in) at its output. The amount of "leakage" may be controlled by setting a leakage factor K in a leakage controlling component 181 of the differentiator 18. The differentiator 18 being a slightly leaky differentiator 18 may enable the removal of leftover DC components of the TDC code.

The re-wrap unit 19 may be configured for re-wrapping the differentiated TDC output codes 21 (Δ_in) according to the following formula:

$$\Delta_{out} = (2C - |\Delta\_in|) * \text{inv}(\text{sign}(\Delta\_in))$$

thereby respectively adding/subtracting double the TDC output gain 2 C, i.e., the unwrap value, to/from the differentiated TDC output code 21 (Δ_in) in case of a negative/positive differentiated TDC output code 21 (Δ_in) having an absolute value larger than the TDC output gain C, i.e., the limit value. This operation may, for example, be performed in the re-wrap unit 19 by: a) adding the TDC output gain C to the differentiated TDC output code 21 (Δ_in) in a first part 191 of the re-wrap unit 19, b) calculating the modulus of the division of the sum of the TDC output code 21 (Δ_in) and the TDC output gain C by double the TDC output gain 2 C in a second part 192 of the re-wrap unit 19, and c) subtracting the output gain C from the resulting modulus in a third part 193 of the re-wrap unit 19, which results in the re-wrapped differentiated TDC output codes 22 (Δ_out). Furthermore, the re-wrap unit 19 may be configured for forwarding the re-wrapped differentiated TDC output codes 22 (Δ_out) to the integrator 20 of the unwrapping unit 17 for further processing.

The integrator 20 may be configured for integrating the re-wrapped differentiated TDC output codes 22 (Δ_out). By adding subsequent rewrapped differentiated TDC output codes 22 (Δ_out) together, this may result in the unwrapped TDC output codes 23.

Figure 9:
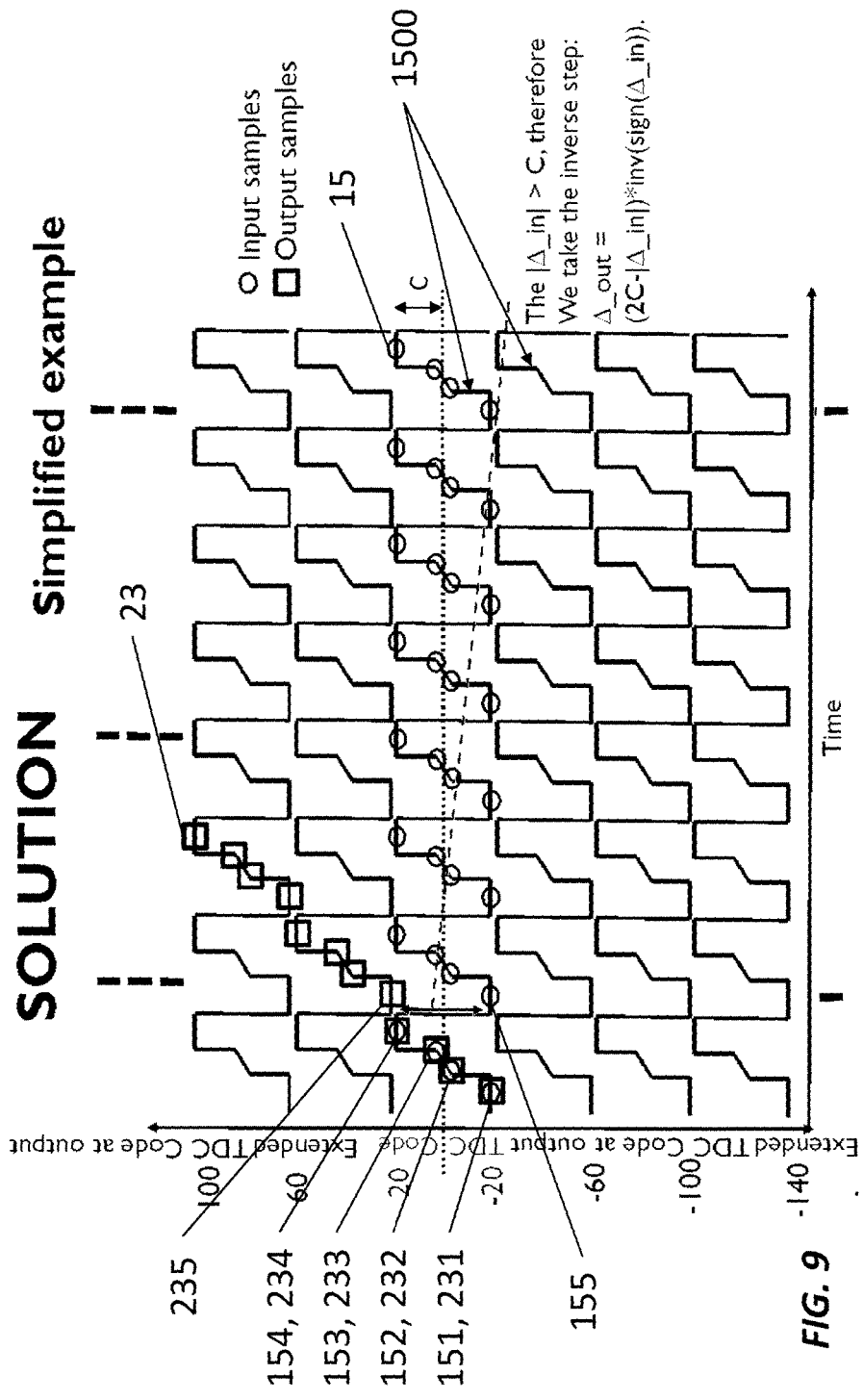
FIG. 9 shows a TDC output of the DPLL of FIG. 1 with both the increased out-of-range gain of the TDC and the unwrapping of the TDC output, according to an example embodiment.

A result of this process of unwrapping the TDC output codes 15 is illustrated by a graph shown in FIG. 9. This graph shows the wrapped TDC output codes 15 (input samples, circles) that are provided to the unwrapping unit 17, together with the unwrapped TDC output codes 23 (output samples, squares) that are being output by the unwrapping unit 17. The full lines show the TDC output gain curve 1500, from which it can be seen that the TDC 14 is provided in this embodiment with the increased out-of-range gain. It should, however, be understood that a TDC 14 without an increased out-of-range gain may also be used, such as, for example, the TDC 14 of FIG. 5a. The graph shows that no unwrapping is required for the first four TDC output codes 151-154, provided to the unwrapping unit 17 as input samples, because they only increase subsequently by an amount smaller than the limit value of the TDC output gain C. As such, the first four unwrapped TDC output codes 231-234, which are being output by the unwrapping unit 17 as output samples, are the same as the first four TDC output codes 151-154. Between the fourth TDC output code 154 and the fifth TDC output code 155 there is, however, a decrease in the TDC output 15 that is larger than the limit value of the TDC output gain C. This decrease is corrected by the unwrapping unit 17 by shifting the fifth TDC output code 155 upwards with the unwrap value of two times the TDC output gain, i.e., 2 C, resulting in the fifth unwrapped TDC output code 235. The unwrapping process is repeated for all subsequent TDC output codes 15 which are provided as input samples to the unwrapping unit 17, resulting in the unwrapped phase trajectory 23 of the TDC output.

Figure 10:
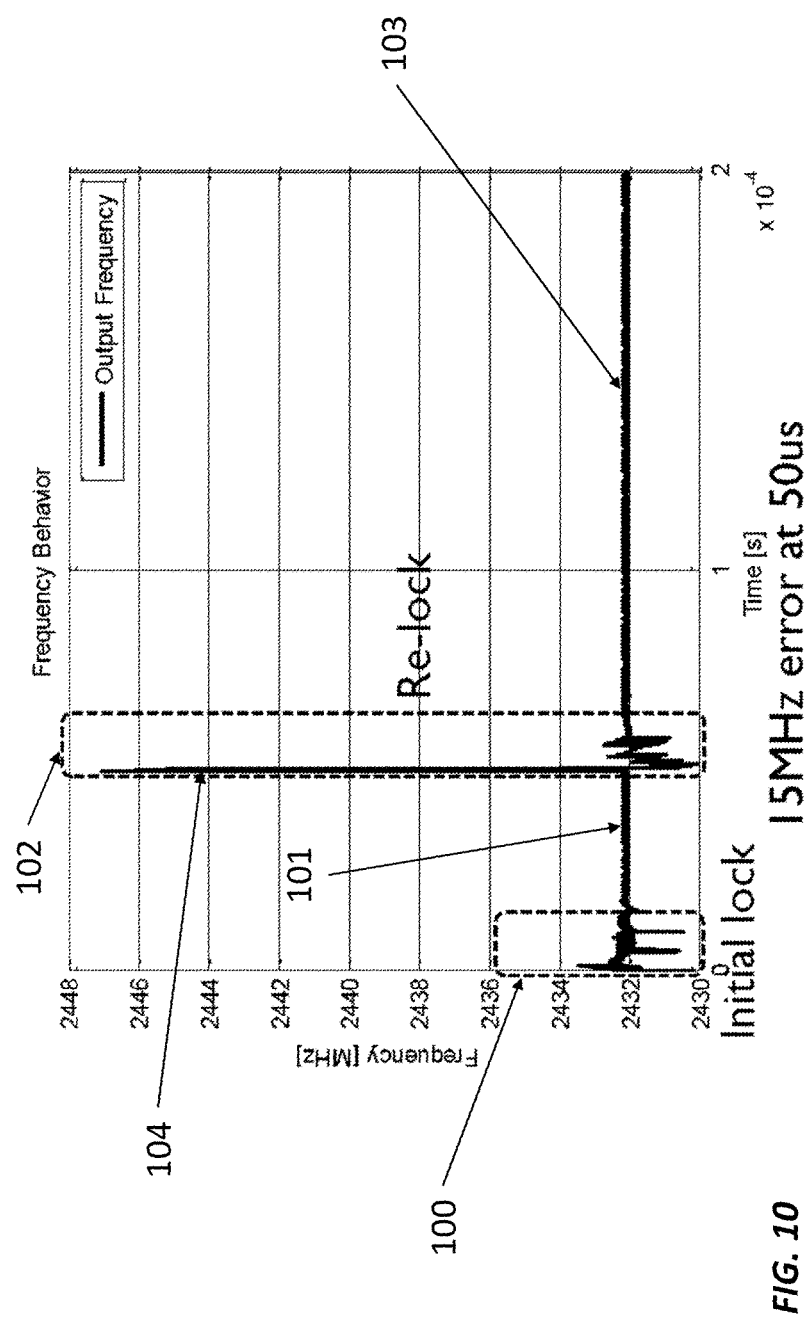
FIG. 10 shows a frequency output of the DPLL of FIG. 1, with both the increased out-of-range gain of the TDC and the unwrapping of the TDC output, in response to a frequency disturbance of +15 MHz, resulting in a phase-locked state, according to an example embodiment.
Figure 11:
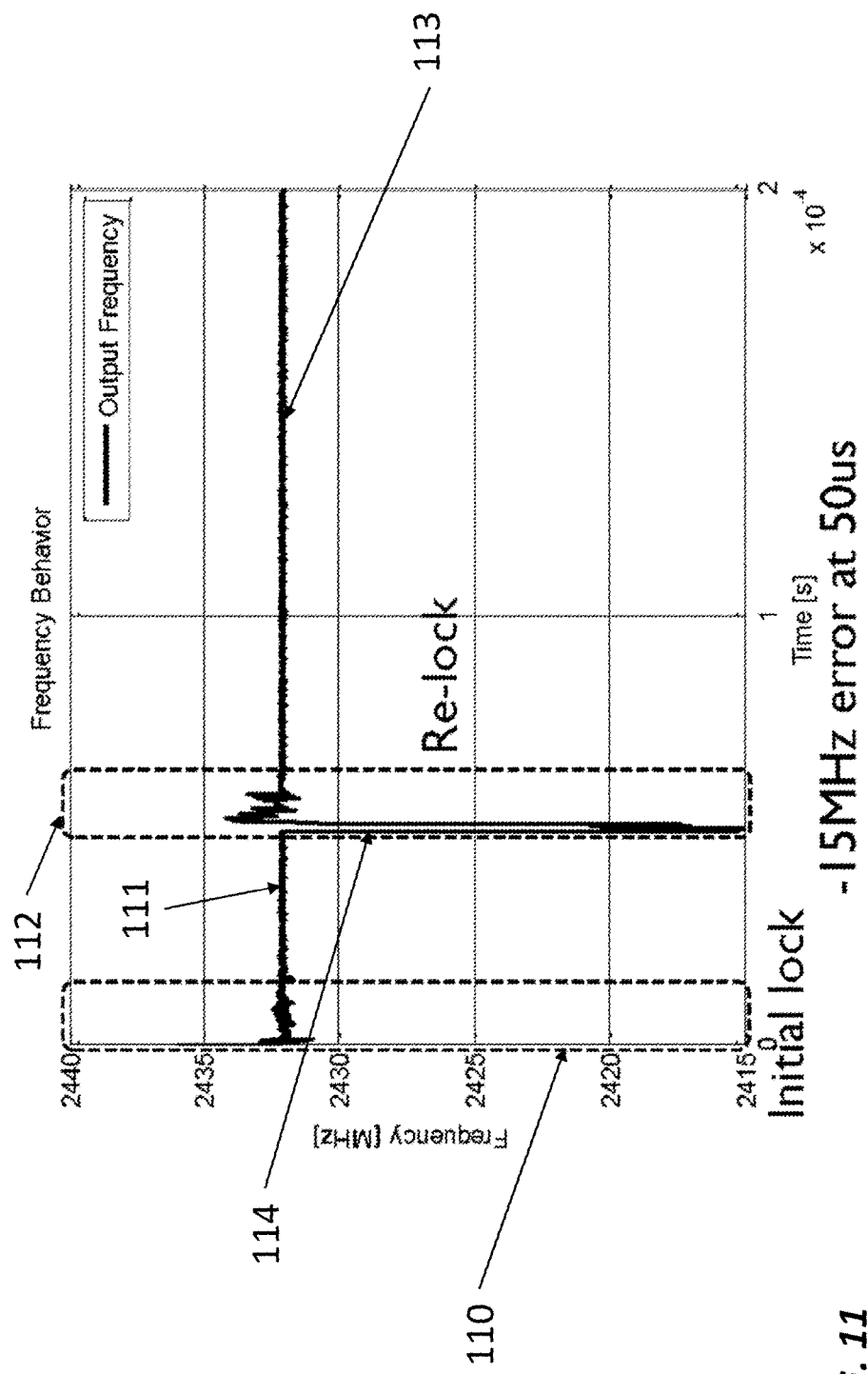
FIG. 11 shows a frequency output of the DPLL of FIG. 1, with both the increased out-of-range gain of the TDC and the unwrapping of the TDC output, in response to a frequency disturbance of −15 MHz, resulting in a phase-locked state, according to an example embodiment.

A result of the unwrapping process on the frequency output of the DPLL 1 is shown in FIGS. 10 and 11. These figures show a plot of the frequency output of the DPLL 1 as a function of time in response to a frequency disturbance 104, 114 of respectively +15 MHz and −15 MHz. The plots show how the DPLL 1, with both the integer circuit 9 and the fractional circuit 12 activated, obtains initial phase locking in a first section 100, 110. After the initial phase lock, the integer circuit 9 is deactivated, and, without any frequency disturbances, the DPLL 1 remains in the phase-locked state in a second section 101, 111 of the frequency output. When confronted, however, with the frequency disturbance 104, 114 of respectively +15 MHz and −15 MHz, the frequency output changes respectively upwards and downwards to a higher and lower frequency. Even with such a large frequency disturbance, in comparison with the frequency disturbance 404 of +4 MHz in FIG. 7, however, the DPLL 1 is able to re-acquire the phase lock in the third section 102, 112 of the frequency output, such that the frequency output pulls back to the initial stable frequency output in the final section 103, 113. This is caused by the combination of the TDC 14 with the increased out-of-range gain, which provides a stronger feedback force, and the unwrapping of the TDC output 15, which provides a corrected feedback force, to bring the DPLL 1 back to the phase-locked state. As such, the lock-in range of the DPLL 1 may be largely increased, in comparison with the much smaller lock-in range of ±3 MHz when only using the second enhancement technique of increasing the out-of-range gain of the TDC 14, and the lock-in range of ±2 MHz when none of the enhancement techniques are used.

FIGS. 10 and 11 also show how the process of unwrapping the TDC output 15 enables the DPLL 1 to re-acquire the phase lock more quickly (faster relocking), as compared to the time period 202, 602 during which the DPLL 1 re-acquires the phase lock in FIGS. 2 and 6. Whereas in FIGS. 2 and 6 the time 202, 602 during which the DPLL 1 re-acquires the phase lock is roughly 100-200 µs, the DPLL 1 is able to re-acquire the phase lock in a time below 10 µs in FIGS. 10 and 11. This is because, with the unwrapping, the unwrapped TDC output 23 may extend outside of the normal TDC output range, thereby providing a stronger control to the DCO 7, whereas, without the unwrapping, the DCO 7 is controlled by the more slowly changing average of the TDC output 15.

In embodiments where the first enhancement technique is used without the second enhancement technique, a lock-in range of ±8 MHz may be achieved.

Figure 12:
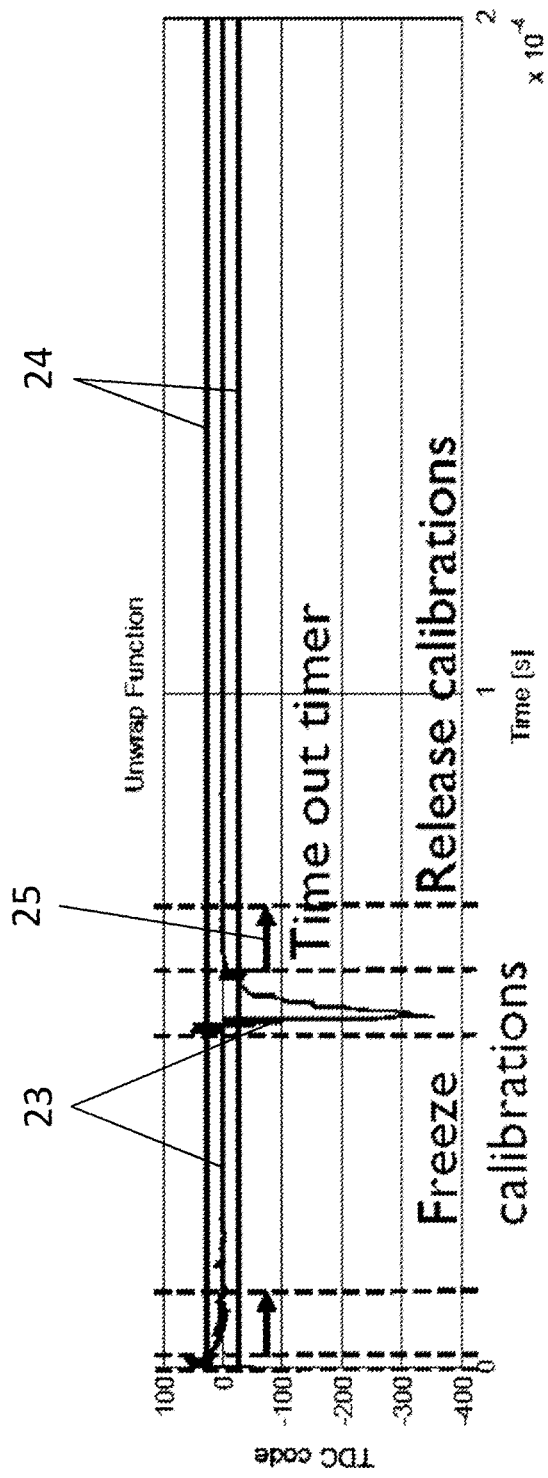
FIG. 12 shows the activation/deactivation of the calibration loops in the DPLL of FIG. 1 in response to the unwrapped TDC output, according to an example embodiment.

FIG. 12 illustrates how the unwrapped TDC output 23 can be used for detecting the locking state of the DPPL 1 by tracking if the unwrapped TDC output 23 remains within a predetermined range 24 indicative of a phase-locked state of the DPLL 1. This tracking may also be used for disabling or freezing any calibration loops of the DPLL 1 if the DPLL 1 is in an unlocked state, e.g., when the unwrapped TDC output 23 is outside the predetermined range 24, and subsequently re-enabling or releasing the calibration loops after a predetermined period 25 if the DPLL 1 has returned to a phase-locked state, e.g., when the unwrapped TDC output 23 is within the predetermined range 24 again.

What is claimed is:

1. A Digital Phase Locked Loop (DPLL) for phase locking an output signal to a reference clock signal, the DPLL comprising:
    a phase detector configured for detecting a phase error of a feedback signal with respect to the reference clock signal, wherein the feedback signal is the output signal of the DPPL fed back to an input of the phase detector, wherein the phase detector comprises:
        an integer circuit configured for generating a first control signal representative of an integer phase error; and
        a fractional circuit comprising a Time-to-Digital Converter (TDC) configured for processing the feedback signal and a delayed reference clock signal to generate a TDC output, wherein the fractional circuit is configured for generating from the TDC output a second control signal representative of a fractional phase error;
    a digitally controlled oscillator (DCO) configured for generating the output signal based at least on a frequency control word and at least one control signal representative of the phase error detected by the phase detector; and
    an unwrapping unit configured for unwrapping the TDC output, wherein unwrapping the TDC output comprises shifting the TDC output when a change in the TDC output is larger than a predetermined limit value, and wherein shifting the TDC output comprises shifting the TDC output by a predetermined unwrap value in a direction opposite of the change in the TDC output.

2. The DPLL of claim 1, comprising a processing unit configured for:
    activating the integer circuit to obtain initial phase locking, and
    deactivating the integer circuit when initial phase locking is obtained.

3. The DPLL of claim 1, wherein the unwrapping unit comprises:
    a differentiator configured for differentiating subsequent TDC outputs;
    a re-wrap unit configured for re-wrapping the differentiated TDC outputs by:
        (a) adding the predetermined unwrap value to a negative differentiated TDC output when the negative differentiated TDC output has an absolute value larger than the predetermined limit value, or
        (b) subtracting the predetermined unwrap value from a positive differentiated TDC output when the positive differentiated TDC output has an absolute value larger than the limit value; and an integrator configured for integrating the re-wrapped differentiated TDC outputs to obtain unwrapped TDC outputs.

4. The DPLL of claim 1, wherein the predetermined limit value is a value of a gain of the TDC, and wherein the predetermined unwrap value is twice the value of the gain of the TDC.

5. The DPLL of claim 3, wherein the differentiator is further configured for leaking a predetermined amount of the TDC outputs to the differentiated TDC outputs.

6. The DPLL of claim 1, wherein the DPLL further comprises at least one calibration loop, wherein the unwrapping unit is configured for disabling the at least one calibration loop when the unwrapped TDC output is outside a predetermined range, and wherein the unwrapping unit is configured for re-enabling the at least one calibration loop when the unwrapped TDC output returns to within the predetermined range.

7. The DPLL of claim 6, wherein re-enabling the at least one calibration loop comprises re-enabling the at least one calibration loop after a predetermined period when the unwrapped TDC output returns to within the predetermined range.

8. The DPLL of claim 1, wherein the TDC has an increased out-of-range gain.

9. A method for operating a Digital Phase Locked Loop (DPLL) for phase locking an output signal of the DPLL to a reference clock signal, the method comprising:
   supplying the reference clock signal to a first input of a phase detector of the DPLL;
   supplying the output signal of the DPLL as a feedback signal to a second input of the phase detector;
   generating, by an integer circuit of the phase detector, a first control signal representative of an integer phase error of the feedback signal with respect to the reference clock signal;
   processing, by a Time-to-Digital Converter (TDC) of a fractional circuit of the phase detector, the feedback signal and a delayed reference clock signal to generate a TDC output;
   generating from the TDC output a second control signal representative of a fractional phase error of the feedback signal with respect to the reference clock signal;
   unwrapping the TDC output using an unwrapping unit of the DPLL;
   regenerating the output signal of the DPLL using a digitally controlled oscillator (DCO) of the DPLL based at least on a frequency control word and at least one of the first control signal or the second control signal;
   obtaining initial phase locking of the output signal of the DPLL to the reference clock signal by repeating (a) the supplying of the output signal as the feedback signal to the phase detector, (b) the generating of the first control signal, (c) the processing by the TDC, (d) the generating of the second control signal, (e) the unwrapping of the TDC output, and (f) the regenerating of the output signal of the DPLL;
   deactivating the integer circuit of the phase detector after obtaining the initial phase locking; and
   tracking the phase locking of the output signal of the DPLL to the reference clock signal by repeating (a) the supplying of the output signal as the feedback signal to the phase detector, (b) the processing by the TDC, (c) the generating of the second control signal, (d) the unwrapping of the TDC output, and (e) the regenerating of the output signal of the DPLL.

10. The method of claim 9, wherein deactivating the integer circuit of the phase detector comprises causing the integer circuit to no longer generate the first control signal representative of the integer phase error of the feedback signal with respect to the reference clock signal.

11. The method of claim 9, wherein unwrapping the TDC output comprises shifting the TDC output when a change in the TDC output is larger than a predetermined limit value, wherein shifting the TDC output comprises shifting the TDC output by a predetermined unwrap value in a direction opposite of the change in the TDC output.

12. The method of claim 11, wherein unwrapping the TDC output comprises:
   differentiating subsequent TDC outputs;
   re-wrapping the differentiated TDC outputs by:
      (a) adding the predetermined unwrap value to a negative differentiated TDC output when the negative differentiated TDC output has an absolute value larger than the predetermined limit value, or
      (b) subtracting the predetermined unwrap value from a positive differentiated TDC output when the positive differentiated TDC output has an absolute value larger than the predetermined limit value; and
   integrating the re-wrapped differentiated TDC outputs to obtain unwrapped TDC outputs.

13. The method of claim 12, wherein the predetermined limit value is a value of a gain of the TDC, and wherein the predetermined unwrap value is twice the value of the gain of the TDC.

14. The method of claim 12, wherein differentiating subsequent TDC outputs comprises adding a predetermined amount of the TDC outputs to the differentiated TDC outputs.

15. The method of claim 9, wherein the DPLL comprises at least one calibration loop, the method further comprising:
   disabling the at least one calibration loop when the unwrapped TDC output is outside a predetermined range; and
   re-enabling the at least one calibration loop when the unwrapped TDC output returns to within the predetermined range.

16. The method of claim 15, wherein re-enabling the at least one calibration loop comprises re-enabling the at least one calibration loop after a predetermined period when the unwrapped TDC output returns to within the predetermined range.

17. The method of claim 9, further comprising increasing an out-of-range gain of the TDC by a processing unit of the DPLL.

* * * * *